(12) United States Patent
Gao et al.

(10) Patent No.: US 11,114,621 B2
(45) Date of Patent: Sep. 7, 2021

(54) ELECTROACTIVE MATERIALS (71) Applicant: LG Chem, Ltd., Seoul (KR)

(72) Inventors: Weiying Gao, Landenberg, PA (US); Norman Herron, Newark, DE (US)

(73) Assignee: LG Chem, Ltd.

( * ) Notice: Subject to any disclaimer, the term of this patent is extended or adjusted under 35 U.S.C. 154(b) by 305 days.

(21) Appl. No.: 16/311,387

(22) PCT Filed: Jun. 26, 2017

(86) PCT No.: PCT/US2017/039279
§ 371 (c)(1),
(2) Date: Dec. 19, 2018

(87) PCT Pub. No.: WO2018/017288
PCT Pub. Date: Jan. 25, 2018

(65) Prior Publication Data
US 2019/0237673 A1 Aug. 1, 2019

Related U.S. Application Data (60) Provisional application No. 62/364,685, filed on Jul. 20, 2016.

(51) Int. Cl.
*H01L 51/00* (2006.01)
*H01L 51/50* (2006.01)
*C09K 11/06* (2006.01)

(52) U.S. Cl.
CPC .......... *H01L 51/0054* (2013.01); *C09K 11/06* (2013.01); *H01L 51/00* (2013.01);
(Continued)

(58) Field of Classification Search
None
See application file for complete search history.

(56) References Cited

U.S. PATENT DOCUMENTS

2004/0102577 A1  5/2004  Hsu et al.
2004/0127637 A1  7/2004  Hsu et al.
(Continued)

FOREIGN PATENT DOCUMENTS

JP    2010526134 A   7/2010
JP    2011132419 A   7/2011
(Continued)

OTHER PUBLICATIONS

KR20130022071, machine translation from Google Patents downloaded Jan. 14, 2021.*
(Continued)

*Primary Examiner* — Clinton A Brooks
(74) *Attorney, Agent, or Firm* — Lerner, David, Littenberg, Krumholz & Mentlik, LLP (57) ABSTRACT

There is disclosed an electroactive composition including (a) a host compound having Formula I (I)

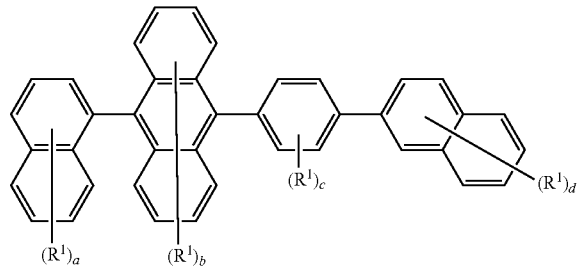

and (b) a photoactive dopant. In Formula I: $R^1$ is the same or different at each occurrence and is D, alkyl, silyl, germyl, deuterated alkyl, deuterated silyl, or deuterated germyl; a is (Continued)

an integer from 0-7; b is an integer from 0-8; c is an integer from 0-4; and d is an integer from 0-7.

4 Claims, 2 Drawing Sheets

(52) U.S. Cl.
CPC ........ *H01L 51/006* (2013.01); *H01L 51/0052* (2013.01); *H01L 51/0058* (2013.01); *H01L 51/0072* (2013.01); *H01L 51/50* (2013.01); *H01L 51/5012* (2013.01); *H01L 51/5092* (2013.01); *H01L 51/5056* (2013.01); *H01L 51/5072* (2013.01)

(56) References Cited

U.S. PATENT DOCUMENTS

| | | |
|---|---|---|
| 2005/0205860 A1 | 9/2005 | Hsu et al. |
| 2010/0133996 A1 | 6/2010 | Moon et al. |
| 2016/0020405 A1 | 1/2016 | Ito et al. |

FOREIGN PATENT DOCUMENTS

| | | |
|---|---|---|
| JP | 2015013805 A | 1/2015 |
| JP | 2015065325 A | 4/2015 |
| KR | 20080099796 A | 11/2008 |
| KR | 20130022071 A | 3/2013 |
| KR | 20150043020 A | 4/2015 |
| WO | 2009018009 A1 | 2/2009 |
| WO | 2011028216 A1 | 3/2011 |
| WO | 2011053334 A1 | 5/2011 |
| WO | 2011159872 A1 | 12/2011 |
| WO | 2013150674 A1 | 10/2013 |
| WO | 2014065391 A1 | 5/2014 |
| WO | 2015009076 A1 | 1/2015 |
| WO | 2015089304 A1 | 6/2015 |

OTHER PUBLICATIONS

CRC Handbook of Chemistry and Physics, 81st Edition (2000-2001) Please see the attached placeholder and note that the USPTO generally has access to CRC-published texts: https://www.uspto.gov/learning-and-resources/support-centers/scientific-and-technical-information-center-stic/electronic <https://protect-us.mimecast.com/s/Z4RwCIYMpLF26ZX4iGsjTI?domain=uspto.gov>.

Gustafsson, G. "Flexible Light-Emitting Diodes Made From Soluble Conducting Polymer", Nature vol. 357, pp. 477 479 (Jun. 11, 1992).

International Search Report including the Written Opinion for Application No. PCT/US2017/039279 dated Oct. 30, 2017, pp. 1-9.

Wang, Y. "Photoconductive Polymers", Kirk Othmer Encyclopedia of Chemical Technology, Fourth Edition, vol. 18, pp. 837-860 (Mar. 29, 1996).

\* cited by examiner

ELECTROACTIVE MATERIALS

CLAIM OF BENEFIT OF PRIOR APPLICATION

This application claims the benefit of U.S. Provisional Application No. 62/364,685, filed Jul. 20, 2016.

BACKGROUND INFORMATION

Field of the Disclosure

The present disclosure relates to novel electroactive compounds. The disclosure further relates to electronic devices having at least one layer comprising such an electroactive compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used. The light-emitting materials may be used alone or may be present in an electroactive host material.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a compound having Formula I (I)

wherein:
R$^1$ is the same or different at each occurrence and is selected from the group consisting of D, alkyl, silyl, germyl, deuterated alkyl, deuterated silyl, and deuterated germyl;

a is an integer from 0-7;
b is an integer from 0-8;
c is an integer from 0-4; and
d is an integer from 0-7.

There is further provided an electroactive composition comprising (a) a host compound having Formula I and (b) a photoactive dopant.

There is further provided an electronic device having at least one layer comprising a compound having any Formula I.

There is further provided an electronic device having a photoactive layer comprising the electroactive composition.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a compound having Formula I, as described in detail below.

There is further provided an electroactive composition comprising (a) a host compound having Formula I and (b) a photoactive dopant, as described in detail below.

There is further provided an electronic device having at least one layer comprising a compound having any Formula I.

There is further provided an electronic device having a photoactive layer comprising the electroactive composition.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Compound of Formula I, the Electroactive Composition, the Electronic Device, and finally Examples.

1. Definitions and Clarification of Terms

Before addressing details of embodiments described below, some terms are defined or clarified.

As used in the "Definitions and Clarification of Terms", R, R' and R" and any other variables are generic designations and may be the same as or different from those defined in the formulas.

The term "alkyl" is intended to mean a group derived from an aliphatic hydrocarbon and includes a linear, a branched, or a cyclic group. A group "derived from" a compound, indicates the radical formed by removal of one or more H or D. The term "branched alkyl" is intended to mean a group derived from an aliphatic hydrocarbon that has at least one secondary or tertiary carbon. In some embodiments, an alkyl has from 1-20 carbon atoms.

The term "aromatic compound" is intended to mean an organic compound comprising at least one unsaturated cyclic group having 4n+2 delocalized pi electrons.

The term "aryl" is intended to mean a group derived from an aromatic compound having at least one point of attachment. The term includes groups which have a single ring and those which have multiple rings which can be joined by a single bond or fused together. Hydrocarbon aryl groups have only carbon in the ring structures. Heteroaryl groups have at least one heteroatom in a ring structure. In some embodiments, hydrocarbon aryl groups have 6-30 ring carbons. In some embodiments, heteroaryl groups have 3-30 ring carbons.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxy, siloxane, thioalkoxy, —S(O)$_2$—, —C(=O)— N(R')(R"), (R')(R")N-alkyl, (R')(R")N-alkoxyalkyl, (R')(R") N-alkylaryloxyalkyl, —S(O)S-aryl (where s=0-2) or —S(O) S-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups. Any of the preceding groups with available hydrogens, may also be deuterated.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. The notation shown below

[Compound structure $\dashv$—D$_{x-y}$ indicates that the compound is deuterated at any available position and that the total number of deuterium substituents is from x to y. For example, the compound shown below has 8-10 deuterium substituents at any available position The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material in which a dopant is dispersed. The host material may or may not have electronic characteristic(s) or the ability to emit, receive, or filter radiation. In some embodiments, the host material is present in higher concentration than the dopant.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The term "germyl" refers to the group R$_3$Ge—, where R is the same or different at each occurrence and is H, D, C1-20 alkyl, deuterated alkyl, fluoroalkyl, aryl, or deuterated aryl.

The prefix "hetero" indicates that one or more carbon atoms has been replaced with a different atom. In some embodiments, the heteroatom is O, N, S, or combinations thereof.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "siloxane" refers to the group R₃SiOR₂Si—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

The term "siloxy" refers to the group R₃SiO—, where R is the same or different at each occurrence and is H, D, C1-20 alkyl, deuterated alkyl, fluoroalkyl, aryl, or deuterated aryl.

The term "silyl" refers to the group R₃Si—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

In a structure where a substituent bond passes through one or more rings as shown below, it is meant that the substituent R may be bonded at any available position on the one or more rings.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81st Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Compound of Formula I

There is provided a compound having Formula I (I)

wherein:
R¹ is the same or different at each occurrence and is selected from the group consisting of D, alkyl, silyl, germyl, deuterated alkyl, deuterated silyl, and deuterated germyl;
a is an integer from 0-7;
b is an integer from 0-8;
c is an integer from 0-4; and
d is an integer from 0-7.
In some embodiments of Formula I, a=0.
In some embodiments of Formula I, a=1.
In some embodiments of Formula I, a=2.
In some embodiments of Formula I, a=3.
In some embodiments of Formula I, a=4.
In some embodiments of Formula I, a=5.
In some embodiments of Formula I, a=6.
In some embodiments of Formula I, a=7.
In some embodiments of Formula I, a>0.
In some embodiments of Formula I, b=0.
In some embodiments of Formula I, b=1.
In some embodiments of Formula I, b=2.
In some embodiments of Formula I, b=3.
In some embodiments of Formula I, b=4.

In some embodiments of Formula I, b=5.
In some embodiments of Formula I, b=6.
In some embodiments of Formula I, b=7.
In some embodiments of Formula I, b=8.
In some embodiments of Formula I, b>0.
In some embodiments of Formula I, c=0.
In some embodiments of Formula I, c=1.
In some embodiments of Formula I, c=2.
In some embodiments of Formula I, c=3.
In some embodiments of Formula I, c=4.
In some embodiments of Formula I, c>0.
In some embodiments of Formula I, d=0.
In some embodiments of Formula I, d=1.
In some embodiments of Formula I, d=2.
In some embodiments of Formula I, d=3.
In some embodiments of Formula I, d=4.
In some embodiments of Formula I, d=5.
In some embodiments of Formula I, d=6.
In some embodiments of Formula I, d=7.
In some embodiments of Formula I, d>0.
In some embodiments of Formula I, a=b=c=d=0.
In some embodiments of Formula I, a+b+c+d=1-26.
In some embodiments of Formula I, a+b+c+d=1-10.
In some embodiments of Formula I, a+b+c+d=1-4.
In some embodiments of Formula I, a+b+c+d=1-26 and $R^1$=D.
In some embodiments of Formula I, a+b+c+d=5-26 and $R^1$=D.
In some embodiments of Formula I, a+b+c+d=15-26 and $R^1$=D.
In some embodiments of Formula I, a+b+c+d=20-26 and $R^1$=D.
In some embodiments of Formula I, a+b+c+d=26 and $R^1$=D.
In some embodiments of Formula I, at least one of a-d is non-zero and at least one $R^1$=D.
In some embodiments of Formula I, a>0 and at least one $R^1$=D.
In some embodiments of Formula I, b>0 and at least one $R^1$=D.
In some embodiments of Formula I, c>0 and at least one $R^1$=D.
In some embodiments of Formula I, d>0 and at least one $R^1$=D.
In some embodiments of Formula I, at least one of a-d is non-zero and at least one $R^1$=alkyl or deuterated alkyl having 1-6 carbons; in some embodiments, 1-4 carbons.
In some embodiments of Formula I, at least one of a-d is non-zero and at least one $R^1$=trimethylsilyl or a deuterated analog thereof.
In some embodiments of Formula I, at least one of a-d is non-zero and at least one $R^1$=trimethylgermyl or a deuterated analog thereof.
The positions on the compound can be labeled as follows:

In some embodiments of Formula I, a>0 and at least one $R^1$=D. In some embodiments, at least one $R^1$=D and is present on at least one of positions 1-7.
In some embodiments of Formula I, a>0 and at least one $R^1$ is alkyl or deuterated alkyl having 1-6 carbons. In some embodiments, at least one $R^1$ is alkyl or deuterated alkyl and is present on at least one of positions 2, 3, 4, and 5.
In some embodiments of Formula I, a>0 and at least one $R^1$ is trimethylsilyl or deuterated trimethylsilyl. In some embodiments, at least one $R^1$ is trimethyl silyl or deuterated trimethylsilyl and is present on at least one of positions 2, 3, 4, and 5.
In some embodiments of Formula I, a>0 and at least one $R^1$ is trimethylgermyl or deuterated trimethylgermyl. In some embodiments, at least one $R^1$ is trimethylgermyl or deuterated trimethylgermyl and is present on at least one of positions 2, 3, 4, and 5.
In some embodiments of Formula I, b>0 and at least one $R^1$=D. In some embodiments, at least one $R^1$=D and is present on at least one of positions 8-15.
In some embodiments of Formula I, b>0 and at least one $R^1$ is alkyl or deuterated alkyl having 1-6 carbons. In some embodiments, at least one $R^1$ is alkyl or deuterated alkyl and is present on at least one of positions 9, 10, 13, and 14.
In some embodiments of Formula I, b>0 and at least one $R^1$ is trimethylsilyl or deuterated trimethylsilyl. In some embodiments, at least one $R^1$ is trimethylsilyl or deuterated trimethylsilyl and is present on at least one of positions 9, 10, 13, and 14.
In some embodiments of Formula I, b>0 and at least one $R^1$ is trimethylgermyl or deuterated trimethylgermyl. In some embodiments, at least one $R^1$ is trimethylgermyl or deuterated trimethylgermyl and is present on at least one of positions 9, 10, 13, and 14.
In some embodiments of Formula I, c>0 and at least one $R^1$=D. In some embodiments, at least one $R^1$=D and is present on at least one of positions 16-19.
In some embodiments of Formula I, d>0 and at least one $R^1$=D. In some embodiments, at least one $R^1$=D and is present on at least one of positions 20-26.
In some embodiments of Formula I, d>0 and at least one $R^1$ is alkyl or deuterated alkyl having 1-6 carbons. In some embodiments, at least one $R^1$ is alkyl or deuterated alkyl and is present on at least one of positions 20, 23, 24, 25, and 26.
In some embodiments of Formula I, d>0 and at least one $R^1$ is trimethylsilyl or deuterated trimethylsilyl. In some embodiments, at least one $R^1$ is trimethylsilyl or deuterated trimethylsilyl and is present on at least one of positions 20, 23, 24, 25, and 26.
In some embodiments of Formula I, d>0 and at least one $R^1$ is trimethylgermyl or deuterated trimethylgermyl. In some embodiments, at least one $R^1$ is trimethylgermyl or deuterated trimethylgermyl and is present on at least one of positions 20, 23, 24, 25, and 26.
In some embodiments of Formula I, a=1 and $R^1$ is present on one of positions 2, 3, 4, and 5.
In some embodiments of Formula I, b=1 and $R^1$ is present on one of positions 9, 10, 13, and 14.
In some embodiments of Formula I, d=1 and $R^1$ is present on one of positions 20, 23, 24, 25, and 26.
In some embodiments of Formula I, at least one of a-d is non-zero and at least one $R^1$ is alkyl or deuterated alkyl and is present on at least one of positions 2, 3, 4, 5, 9, 10, 13, 14, 20, 23, 24, 25, and 26.
In some embodiments of Formula I, at least one of a-d is non-zero and at least one $R^1$ is trimethylsilyl or deuterated trimethylsilyl and is present on at least one of positions 2, 3, 4, 5, 9, 10, 13, 14, 20, 23, 24, 25, and 26.

In some embodiments of Formula I, at least one of a-d is non-zero and at least one $R^1$ is trimethylgermyl or deuterated trimethylgermyl and is present on at least one of positions 2, 3, 4, 5, 9, 10, 13, 14, 20, 23, 24, 25, and 26.

In some embodiments of Formula I, at least one of a-d is non-zero and at least one $R^1$ is selected from the group consisting of alkyl, trimethylsilyl, trimethylgermyl, and deuterated analogs thereof and is present on at least one of positions 2, 3, 4, 5, 9, 10, 13, 14, 20, 23, 24, 25, and 26.

Any of the above embodiments for Formula I can be combined with one or more of the other embodiments, so long as they are not mutually exclusive. For example, the embodiment in which a=1 can be combined with the embodiment in which at least one $R^1$ is alkyl and the embodiment in which b=1 and at least one $R^1$ is D. The same is true for the other non-mutually-exclusive embodiments discussed above. The skilled person would understand which embodiments were mutually exclusive and would thus readily be able to determine the combinations of embodiments that are contemplated by the present application.

The compounds of Formula I can be made using any technique that will yield a C—C bond. A variety of such techniques are known, such as Suzuki, Yamamoto, and Stille couplings as well as metal catalyzed and oxidative direct arylation.

Deuterated compounds can be prepared in a similar manner using deuterated precursor materials or, more generally, by treating the non-deuterated compound with deuterated solvent, such as benzene-d6, in the presence of a Bronsted acid H/D exchange catalyst, such as trifluoromethanesulfonic acid or a Lewis acid H/D exchange catalyst, such as aluminum trichloride or ethyl aluminum dichloride.

Exemplary preparations are given in the Examples.

Some non-limiting examples of compounds having Formula I are shown below.

Compound 1

Compound 2

Compound 3

Compound 4

Compound 5

Compound 6

Compound 7

-continued

Compound 8

Compound 9

Compound 10

The compounds can be formed into layers for electronic devices. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous liquid deposition techniques, include but are not limited to, spin coating, gravure coating, curtain coating, dip coating, slot-die coating, spray coating, and continuous nozzle coating. Discontinuous liquid deposition techniques include, but are not limited to, ink jet printing, gravure printing, and screen printing.

In some embodiments, the new compounds having Formula I can be used as hole transport materials in devices.

In some embodiments, the new compounds having Formula I are electroluminescent and can be used as emissive materials in devices.

In some embodiments, the new compounds having Formula I can be used as hosts for electroluminescent materials.

In some embodiments, the new compounds having Formula I can be used as electron transport materials in devices.

3. Electroactive Composition

The electroactive composition comprises (a) a host compound having Formula I and (b) a photoactive dopant.

The host compound having Formula I is described in detail above.

Electroluminescent ("EL") materials which can be used as a dopant in the electroactive composition, include, but are not limited to, small molecule organic luminescent compounds, luminescent metal complexes, conjugated polymers, and mixtures thereof. Examples of small molecule luminescent organic compounds include, but are not limited to, chrysenes, pyrenes, perylenes, rubrenes, coumarins, anthracenes, stilbenes, thiadiazoles, benzofluorenes, naphthofurans, derivatives thereof, deuterated analogs thereof, and mixtures thereof. Examples of metal complexes include, but are not limited to, metal chelated oxinoid compounds and cyclometallated complexes of metals such as iridium and platinum. Examples of conjugated polymers include, but are not limited to poly(phenylenevinylenes), polyfluorenes, poly(spirobifluorenes), polythiophenes, poly(p-phenylenes), copolymers thereof, deuterated analogs thereof, and mixtures thereof.

In some embodiments, the dopant is deuterated.

In some embodiments, the dopant is a small organic luminescent compound.

In some embodiments, the dopant is selected from the group consisting of a non-polymeric spirobifluorene compound, a fluoranthene compound, substituted derivatives thereof, and deuterated analogs thereof.

In some embodiments, the dopant is a compound having aryl amine groups. In some embodiments, the dopant has Formula II or Formula III below:

(II)

(III)

where:
A is the same or different at each occurrence and is a hydrocarbon aryl or heteroaryl group having from 3-60 ring carbon atoms;
Q' is a hydrocarbon aryl or heteroaryl having from 3-60 ring carbon atoms;
p and q are independently an integer from 1-6.

In some embodiments of the above formula, Q' in each formula has at least three condensed rings.

In some embodiments of Formula II and Formula III, p and q are equal to 1.

In some embodiments Formula II and Formula III, Q' is a styryl or styrylphenyl group.

In some embodiments Formula II and Formula III, Q' is an aromatic group having at least two condensed rings. In some embodiments, Q' is derived from a compound selected from the group consisting of naphthalene, anthracene, chrysene, pyrene, tetracene, xanthene, perylene, coumarin, rhodamine, quinacridone, rubrene, phenanthrene, benzofluorene, naphthofuran, naphthodifuran, naphthotrifuran, naphthotetrafuran, substituted derivatives thereof, and deuterated analogs thereof.

In some embodiments Formula II and Formula III, Q' is derived from a compound selected from the group consisting of anthracene, chrysene, pyrene, benzofluorene, naphthofuran, naphthodifuran, substituted derivatives thereof, and deuterated analogs thereof.

In some embodiments Formula II and Formula III, A is selected from the group consisting of phenyl, biphenyl, terphenyl, naphthyl, naphthylphenyl, anthracenyl, substituted derivatives thereof, and deuterated analogs thereof.

In some embodiments, the dopant has the formula below:

where:

Y is the same or different at each occurrence and is an aromatic group having 3-60 carbon atoms;

Q" is an aromatic group, a divalent triphenylamine residue group, or a single bond.

In some embodiments, the dopant is an aryl acene. In some embodiments, the dopant is a non-symmetrical aryl acene.

In some embodiments, the dopant is blue light-emitting. The term "blue light-emitting" is intended to refer to a material capable of emitting radiation that has an emission maximum at a wavelength in a range of approximately 400-500 nm. In some embodiments, the emission maximum at a wavelength in a range of approximately 445-490 nm. In some embodiments, the dopant has a photoluminescence y-coordinate of less than 0.15, according to the C.I.E. chromaticity scale (Commission Internationale de L'Eclairage, 1931); in some embodiments, less than 0.10; in some embodiments, less than 0.090.

In some embodiments, the dopant has Formula III, where p=q=1 and Q' is derived from a compound selected from the group consisting of anthracene, chrysene, pyrene, benzofluorene, naphthofuran, naphthodifuran, substituted derivatives thereof, and deuterated analogs thereof.

In some embodiments, the weight ratio of dopant to host compound having Formula I is in the range of 2:98 to 50:50; in some embodiments, 3:97 to 30:70; in some embodiments, 5:95 to 20:80.

In some embodiments, surprisingly and unexpectedly, devices including the new electroactive composition described herein have increased lifetime relative to similar anthracene host compounds. In some embodiments, devices including the new electroactive composition with a non-deuterated compound having Formula I have lifetimes about the same as similar deuterated anthracene host compounds.

In some embodiments, surprisingly and unexpectedly, devices including the new electroactive composition described herein have increased efficiency relative to similar anthracene host compounds.

4. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode).

Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

Figure 1:
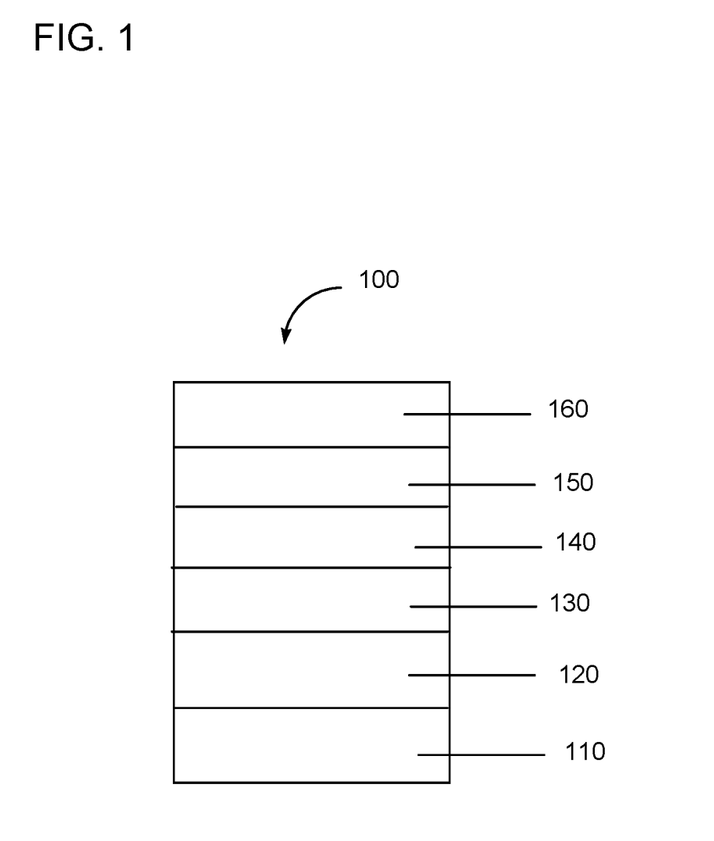
FIG. 1 includes an illustration of one example of an organic electronic device including the compound described herein.

One illustration of an organic electronic device structure including the new composition described herein is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
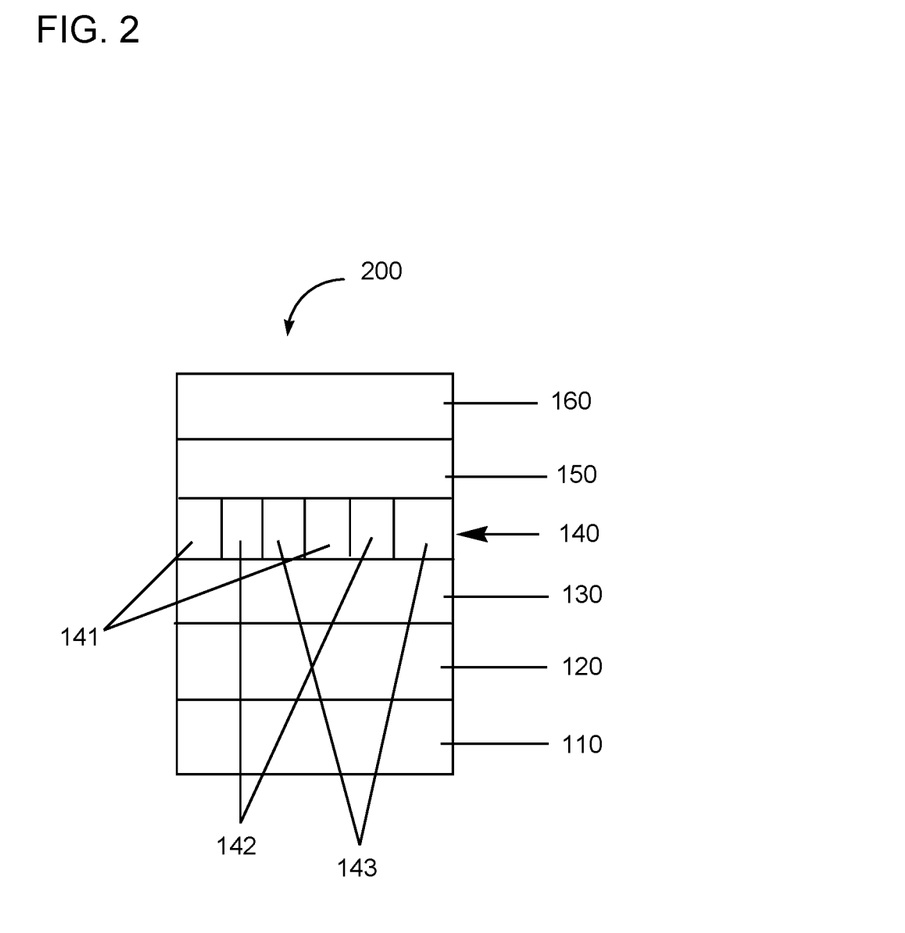
FIG. 2 includes an illustration of another example of an organic electronic device including the compound described herein.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, photoactive layer 140, electron transport layer 150, and cathode 160. The photoactive layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new compounds having Formula I described herein may be present in one or more of the electroactive layers of a device.

In some embodiments, the new compounds having Formula I are useful as hole transport materials in layer 130.

In some embodiments, the new compounds having Formula I are useful as photoactive materials in layer 140. In some embodiments, the new compounds having Formula I are present as photoactive dopant materials in one or more host materials.

In some embodiments, the new composition comprising a compound having Formula I and a dopant is useful as photoactive layer 140.

In some embodiments, an organic electronic device includes an anode, a cathode, and at least one organic active layer therebetween, where the organic active layer includes a compound of Formula I.

In some embodiments, an organic electronic device includes an anode, a cathode, and a photoactive layer therebetween, where the photoactive layer includes a composition comprising a compound having Formula I and a dopant.

In some embodiments, an organic electronic device includes an anode, a cathode, and a photoactive layer therebetween, and further includes an additional organic active layer including a compound of Formula I. In some embodiments, the additional organic active layer is a hole transport layer.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material.

In some embodiments, layer 130 includes a compound having Formula I. In some embodiments, layer 130 includes only a compound having Formula I, where additional materials that would materially alter the principle of operation or the distinguishing characteristics of the layer are not present.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4, 4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N, N, N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes a compound having Formula I as a photoactive material. In some embodiments, the photoactive layer further comprises a host material. Examples of host materials include, but are not limited to, chrysenes, phenanthrenes, triphenylenes, phenanthrolines, triazines, naphthalenes, anthracenes, quinolines, isoquinolines, quinoxalines, phenylpyridines, carbazoles, indolocarbazoles, indoloindoles, furans, benzofurans, dibenzofurans, benzodifurans, naphthofurans, naphthodifurans, metal quinolinate complexes, substituted derivatives thereof, deuterated analogs thereof, and combinations thereof. In some embodiments, the host materials are deuterated.

In some embodiments, the photoactive layer includes a compound having Formula I as host material and a photoactive dopant. The photoactive dopant can be an organic electroluminescent ("EL") material, as described in detail above.

In some embodiments, the photoactive layer further includes a second host material. Examples of second host materials include, but are not limited to chrysenes, phenanthrenes, triphenylenes, phenanthrolines, triazines, naphthalenes, anthracenes, quinolines, isoquinolines, quinoxalines, phenylpyridines, carbazoles, indolocarbazoles, indoloindoles, furans, benzofurans, dibenzofurans, benzodifurans, naphthofurans, naphthodifurans, metal quinolinate complexes, substituted derivatives thereof, and deuterated analogs thereof.

In some embodiments, the second host is selected from the group consisting of triphenylenes, carbazoles, indolocarbazoles, indoloindoles, furans, benzofurans, dibenzofurans, naphthodifurans, substituted derivatives thereof, and deuterated analogs thereof.

In some embodiments, the weight ratio of host material having Formula I to second host material is in the range of 10:1 to 1:10; in some embodiments, 3:1 to 1:3.

In some embodiments, photoactive layer 140 includes a photoactive dopant and a host material having Formula I.

In some embodiments, photoactive layer 140 includes only a photoactive dopant and a host material having Formula I, where additional materials that would materially alter the principle of operation or the distinguishing characteristics of the layer are not present.

In some embodiments, photoactive layer 140 includes a photoactive dopant, a host material having Formula I, and a second host material.

In some embodiments, photoactive layer 140 includes only a photoactive dopant, a first host material having Formula I, and a second host material, where additional materials that would materially alter the principle of operation or the distinguishing characteristics of the layer are not present.

The weight ratio of dopant to total host material is in the range of 2:98 to 50:50; in some embodiments, 3:97 to 30:70; in some embodiments, 5:95 to 20:80.

Optional layer 150 can function both to facilitate electron transport, and also serve as a confinement layer to prevent quenching of the exciton at layer interfaces. Preferably, this layer promotes electron mobility and reduces exciton quenching.

In some embodiments, layer 150 includes other electron transport materials. Examples of electron transport materials which can be used in the optional electron transport layer 150, include metal chelated oxinoid compounds, including metal quinolate derivatives such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof. In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art.

In some embodiments, the hole transport layer is formed by liquid deposition of hole transport material and any additional materials in a liquid medium. In some embodiments, the liquid medium includes one or more organic solvents. In some embodiments, the organic solvent is an aromatic solvent. In some embodiments, the organic liquid is selected from chloroform, dichloromethane, chlorobenzene, dichlorobenzene, toluene, xylene, mesitylene, anisole, N-methyl-2-pyrrolidone, tetralin, 1-methoxynaphthalene, cyclohexylbenzene, and mixtures thereof. The hole transport material can be present in the liquid medium in a concentration of 0.2 to 5 percent (w/v); in some embodiments, 0.4 to 3 percent (w/v).

In some embodiments, the photoactive layer is formed by liquid deposition of the photoactive material and any host material in a liquid medium. Suitable classes of solvents that may be used as the liquid medium include, but are not limited to, aliphatic hydrocarbons (such as decane, hexadecane, and decalin), halogenated hydrocarbons (such as methylene chloride, chloroform, chlorobenzene, benzotrifluoride, and perfluoroheptane), aromatic hydrocarbons (such as non-substituted and alkyl- and alkoxy-substituted benzenes, toluenes and xylenes), aromatic ethers (such as anisole, dibenzyl ether, and fluorinated derivatives), heteroaromatics (such as pyridine) polar solvents (such as tetrahydropyran, dimethylacetamide, N-methyl pyrrolidone, and nitriles such as acetonitrile), esters (such as ethylacetate, propylene carbonate, methyl benzoate, and phosphate esters such as tributylphosphate), alcohols and glycols (such as isopropanol and ethylene glycol), glycol ethers and derivatives (such as propylene glycol methyl ether and propylene glycol methyl ether acetate), ketones (such as cyclopentanone and diisobutyl ketone), and mixtures thereof.

In some embodiments, the device is fabricated by vapor deposition of all the layers.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Example 1

This example illustrates the preparation of a compound having Formula I, Compound 1.

The compound can be prepared according to the following scheme:

where Pd/P represents a palladium catalyst in combination with a phosphine compound and Δ indicates heating.

Equimolar amounts of materials 1 and 2 can be dissolved in toluene. To this can be added 4 mol equivalents of 2M $Na_2CO_3$ solution and the solution sparged with argon for 30 min. To this can be added 0.05 mol equivalents of $Pd(PPh_3)_4$ and the mixture stirred for 6 h at 90° C. After cooling, the reaction mixture can be filtered and concentrated to obtain material 3.

Material 3 can be brominated with $Br_2$ in dichloromethane to obtain material 4.

Equimolar amounts of materials 4 and 5 can be dissolved in toluene. To this can be added 4 mol equivalents of 2M $Na_2CO_3$ solution and the solution sparged with argon for 30 min. To this can be added 0.05 mol equivalents of $Pd(PPh_3)_4$ and the mixture stirred for 6 h at 90° C. After cooling, the reaction mixture can be filtered and concentrated to obtain Compound 1. Compound 1 can be purified by column chromatography.

Synthesis Example 2

This example illustrates the preparation of a compound having Formula I, Compound 2.

The compound can be prepared according to the following scheme:

Under an atmosphere of nitrogen, 4 mol equivalents $AlCl_3$ can be added to 10 mol equivalents of Compound 1 from Synthesis Example 1 dissolved in perdeuterobenzene. The resulting mixture can be stirred at room temperature for six hours after which $D_2O$ (50 mL) can be added. The layers can be separated and the organic layers dried and concentrated to obtain Compound 2. The crude product can be purified by column chromatography.

Comparative Synthesis Example A

Comparative Compound A can be made in a manner analogous to Synthesis Example 1, as shown in the following scheme.

Comparative Synthesis Example B

Comparative Compound B can be made in a manner analogous to Synthesis Example 2, as shown in the following scheme.

-continued

Comparative Compound B

Device Examples (1) Materials

Comparative Compound B has the structure shown above.
Dopant D-1 is a bis(diarylamino)benzofluorene. Such materials have been described in, for example, U.S. Pat. No. 8,465,848.
ET-1 is an aryl phosphine oxide.
ET-2 is lithium quinolate.
HIJ-1 is a hole injection material which is made from an aqueous dispersion of an electrically conductive polymer and a polymeric fluorinated sulfonic acid.
HIJ-2 is 1,4,5,8,9,12-hexaazatriphenylenehexacarbonitrile.
HTM-1 is an arylamino-phenanthrene.
NPD is N,N'-di(1-naphthyl)-N,N'-diphenyl-(1,1'-biphenyl)-4,4'-diamine (2) Device Fabrication OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent, to form a short reduction layer ("SRL"). The workpieces were then placed in a vacuum chamber. The hole injection material, a first hole transport material, a second hole transport material, the photoactive and host materials, electron transport materials, electron injection material, and the Al cathode were then deposited sequentially by thermal evaporation using the appropriate masks, to form the hole injection layer ("HIL"), one or more hole transport layers ("HTL"), the photoactive layer or emissive layer ("EML"), the electron transport layer ("ETL"), and the electron injection layer ("EIL"), followed by the cathode. The chamber was vented, and the devices were encapsulated using a glass lid, desiccant, and UV curable epoxy.

(3) Device Characterization

The OLED devices were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

Device Examples 1-3

These examples illustrate the performance of devices having a photoactive layer including the new compound having Formula I as a host material.

The device had the structure, in order (all percentages are by weight, based on the total weight of the layer):
Glass Substrate
Anode: ITO (50 nm)
SRL: HIJ-1 (100 nm)
HIL: HIJ-2 (7 nm)
HTL1: NPD (90 nm)
HTL2: HTM-1 (20 nm)
EML: host and dopant D-1 as shown in Table 1 (25 nm)
ETL: ET-1:ET-2 (1:1 weight ratio) (26.2 nm)
EIL: ET-2 (3.5 nm)
Cathode: Al (100 nm)
The results are given in Table 1.

TABLE 1

Device results

| Ex. | Host | Ratio | CE | EQE | CIEx | CIEy | V | T80 |
|---|---|---|---|---|---|---|---|---|
| 1 | Compd. 1 | 20:1 | 9.8 | 12.1 | 0.142 | 0.087 | 5.6 | 1050 |
| 2 | Compd. 1 | 13:1 | 10.2 | 12.1 | 0.140 | 0.093 | 5.6 | 1120 |
| 3 | Compd. 1 | 32:1 | 10.0 | 12.3 | 0.141 | 0.089 | 5.6 | 800 |

All data at 1000 nits, unless otherwise specified. Ratio is the host:dopant weight ratio; CE is the current efficiency in cd/A; EQE=external quantum efficiency as a percentage; CIEx and CIEy refer to the x and y color coordinates according to the C.I.E. chromaticity scale (Commission Internationale de L'Eclairage, 1931); V is the voltage @ 15 mA/cm$^2$; T80 is the time in hours for a device to reach 80% of the initial luminance at a current density of 16.5 mA/cm$^2$ and 50° C.

Device Examples 4-6 and Comparative Example A

These examples illustrate the performance of devices having a photoactive layer including the new compound having Formula I as a host material.

The devices had the same structure as in Device Examples 1-3, except that the host and ratio are given in Table 2.

The results are given in Table 2.

TABLE 2

Device results

| Ex. | Host | Ratio | CE | EQE | CIEx | CIEy | V | T80 |
|---|---|---|---|---|---|---|---|---|
| A | B | 20:1 | 10.3 | 12.1 | 0.140 | 0.095 | 5.6 | 1400 |
| 4 | Compd. 2 | 20:1 | 10.5 | 12.3 | 0.140 | 0.096 | 5.6 | 2100 |
| 5 | Compd. 2 | 13:1 | 10.2 | 11.8 | 0.139 | 0.098 | 5.5 | 1900 |
| 6 | Compd. 2 | 32:1 | 10.1 | 12.3 | 0.141 | 0.090 | 5.6 | 1570 |

All data at 1000 nits, unless otherwise specified. Ratio is the host:dopant weight ratio; CE is the current efficiency in cd/A; EQE=external quantum efficiency as a percentage; CIEx and CIEy refer to the x and y color coordinates according to the C.I.E. chromaticity scale (Commission Internationale de L'Eclairage, 1931); V is the voltage @ 15 mA/cm²; T80 is the time in hours for a device to reach 80% of the initial luminance at a current density of 16.5 mA/cm² and 50° C.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electroactive composition comprising (a) a host compound having the following Formula I and (b) a photoactive dopant wherein:
  $R^1$ is D;
  a is an integer from 0-7;
  b is an integer from 0-8;
  c is an integer from 0-4; and
  d is an integer from 0-7; an
  a+b+c+d=15-26.

2. The composition of claim 1, wherein the dopant has Formula II or Formula III where:
  A is the same or different at each occurrence and is a hydrocarbon aryl or heteroaryl group having from 3-60 ring carbon atoms;
  Q' is a hydrocarbon aryl or heteroaryl having from 3-60 ring carbon atoms;
  p and q are independently an integer from 1-6.

3. The composition of claim 2, wherein Q' is derived from a compound selected from the group consisting of anthracene, chrysene, pyrene, benzofluorene, naphthofuran, naphthodifuran, substituted derivatives thereof, and deuterated analogs thereof.

4. An organic electronic device comprising an anode, a cathode, and a photoactive layer therebetween, wherein the photoactive layer comprises the composition of claim 1.

* * * * *